United States Patent
Mallinson et al.

(10) Patent No.: US 8,774,749 B2
(45) Date of Patent: Jul. 8, 2014

(54) VIRTUAL WEAVER ARCHITECTURE FILTER

(75) Inventors: Martin Mallinson, Kelowna (CA); Dustin Forman, Kelowna (CA)

(73) Assignee: ESS Technology, Inc., Fremont, CA (US)

( * ) Notice: Subject to any disclaimer, the term of this patent is extended or adjusted under 35 U.S.C. 154(b) by 33 days.

(21) Appl. No.: 13/515,259

(22) PCT Filed: Dec. 11, 2009

(86) PCT No.: PCT/CA2009/001817
§ 371 (c)(1),
(2), (4) Date: Aug. 16, 2012

(87) PCT Pub. No.: WO2011/069229
PCT Pub. Date: Jun. 16, 2011

(65) Prior Publication Data
US 2012/0300888 A1    Nov. 29, 2012

(51) Int. Cl.
*H04B 1/26*    (2006.01)

(52) U.S. Cl.
USPC ............ 455/323; 455/137; 455/337; 375/349

(58) Field of Classification Search
USPC ......... 455/132, 133, 137, 323, 324, 334, 337; 375/340, 346, 349
See application file for complete search history.

(56) References Cited

U.S. PATENT DOCUMENTS

| | | | |
|---|---|---|---|
| 7,028,070 B2 | 4/2006 | Mallinson | |
| 7,248,625 B2* | 7/2007 | Chien | 375/219 |
| 7,660,374 B2* | 2/2010 | Casabona et al. | 375/346 |
| 7,693,502 B2* | 4/2010 | Sorrells et al. | 455/313 |
| 8,218,687 B2* | 7/2012 | Sayers | 375/322 |
| 2005/0233725 A1 | 10/2005 | Muhammad et al. | |

FOREIGN PATENT DOCUMENTS

| | | |
|---|---|---|
| CA | 2192039 A1 | 6/1997 |
| WO | WO-2008139390 A1 | 11/2008 |

OTHER PUBLICATIONS

International Search Report of PCT/CA2009/001817 dated Sep. 23, 2010, pp. 1-4.
International Search Report of PCT/CA2009/001817 dated Sep. 23, 2010, pp. 1-5.

* cited by examiner

*Primary Examiner* — Nhan Le
(74) *Attorney, Agent, or Firm* — LaRiviere, Grubman & Payne, LLP

(57) ABSTRACT

A virtual Weaver architecture filter is implemented using a sampling mixer that successively processes samples of the input signal in round-robin fashion and provides a sum of the samples as multiplied by coefficients emulating quadrature sinusoidal waveforms. A virtual rather than actual local oscillator is reliably implemented without mismatch. Filtering between the Weaver mixers is eliminated in favor of filtering at the sampling input and effective time division multiplexing is achieved by selecting between resistor combinations that implement different scaling coefficients, resulting in an efficient analog implementation of a virtual Weaver architecture.

1 Claim, 14 Drawing Sheets

Initial
Phase   0.1
Rmax    2000 k
Rtot    10 k
Cycles  5
Length  32

| Index | Sine | R1 | P0 | P1 | P2 | P3 | Cosine | R2 | P0 | P1 | P2 | P3 | R3 |
|---|---|---|---|---|---|---|---|---|---|---|---|---|---|
| 0  | 0.10  | 141.66 | 0 | 1  | 0 | -1 | 1.00  | 14.21  | 1  | 0 | -1 | 0 | 44.281 |
| 1  | 0.88  | 16.02  | 0 | 1  | 0 | -1 | 0.47  | 30.10  | 1  | 0 | -1 | 0 | 229.405 |
| 2  | 0.88  | 16.05  | 0 | 1  | 0 | -1 | -0.47 | 29.90  | -1 | 0 | 1  | 0 | 235.120 |
| 3  | 0.10  | 147.01 | 0 | 1  | 0 | -1 | -1.00 | 14.21  | -1 | 0 | 1  | 0 | 43.831 |
| 4  | -0.77 | 18.27  | 0 | -1 | 0 | 1  | -0.63 | 22.34  | -1 | 0 | 1  | 0 |  |
| 5  | -0.96 | 14.79  | 0 | -1 | 0 | 1  | 0.29  | 48.43  | 1  | 0 | -1 | 0 | 85.310 |
| 6  | -0.29 | 49.01  | 0 | -1 | 0 | 1  | 0.96  | 14.77  | 1  | 0 | -1 | 0 | 84.076 |
| 7  | 0.64  | 22.24  | 0 | 1  | 0 | -1 | 0.77  | 18.32  | 1  | 0 | -1 | 0 |  |
| 8  | 1.00  | 14.21  | 0 | 1  | 0 | -1 | -0.10 | 141.66 | -1 | 0 | 1  | 0 | 44.281 |
| 9  | 0.47  | 30.10  | 0 | 1  | 0 | -1 | -0.88 | 16.02  | -1 | 0 | 1  | 0 | 229.405 |
| 10 | -0.47 | 29.90  | 0 | -1 | 0 | 1  | -0.88 | 16.05  | -1 | 0 | 1  | 0 | 235.120 |
| 11 | -1.00 | 14.21  | 0 | -1 | 0 | 1  | -0.10 | 147.01 | -1 | 0 | 1  | 0 | 43.831 |
| 12 | -0.63 | 22.34  | 0 | -1 | 0 | 1  | 0.77  | 18.27  | 1  | 0 | -1 | 0 |  |
| 13 | 0.29  | 48.43  | 0 | 1  | 0 | -1 | 0.96  | 14.79  | 1  | 0 | -1 | 0 | 85.310 |
| 14 | 0.96  | 14.77  | 0 | 1  | 0 | -1 | 0.29  | 49.01  | 1  | 0 | -1 | 0 | 84.076 |
| 15 | 0.77  | 18.32  | 0 | 1  | 0 | -1 | -0.64 | 22.24  | -1 | 0 | 1  | 0 |  |
| 16 | -0.10 | 141.66 | 0 | -1 | 0 | 1  | -1.00 | 14.21  | -1 | 0 | 1  | 0 | 44.281 |
| 17 | -0.88 | 16.02  | 0 | -1 | 0 | 1  | -0.47 | 30.10  | -1 | 0 | 1  | 0 | 229.405 |
| 18 | -0.88 | 16.05  | 0 | -1 | 0 | 1  | 0.47  | 29.90  | 1  | 0 | -1 | 0 | 235.120 |
| 19 | -0.10 | 147.01 | 0 | -1 | 0 | 1  | 1.00  | 14.21  | 1  | 0 | -1 | 0 | 43.831 |
| 20 | 0.77  | 18.27  | 0 | 1  | 0 | -1 | 0.63  | 22.34  | 1  | 0 | -1 | 0 |  |
| 21 | 0.96  | 14.79  | 0 | 1  | 0 | -1 | -0.29 | 48.43  | -1 | 0 | 1  | 0 | 85.310 |
| 22 | 0.29  | 49.01  | 0 | 1  | 0 | -1 | -0.96 | 14.77  | -1 | 0 | 1  | 0 | 84.076 |
| 23 | -0.64 | 22.24  | 0 | -1 | 0 | 1  | -0.77 | 18.32  | -1 | 0 | 1  | 0 |  |
| 24 | -1.00 | 14.21  | 0 | -1 | 0 | 1  | 0.10  | 141.66 | 1  | 0 | -1 | 0 | 44.281 |
| 25 | -0.47 | 30.10  | 0 | -1 | 0 | 1  | 0.88  | 16.02  | 1  | 0 | -1 | 0 | 229.405 |
| 26 | 0.47  | 29.90  | 0 | 1  | 0 | -1 | 0.88  | 16.05  | 1  | 0 | -1 | 0 | 235.120 |
| 27 | 1.00  | 14.21  | 0 | 1  | 0 | -1 | 0.10  | 147.01 | 1  | 0 | -1 | 0 | 43.831 |
| 28 | 0.63  | 22.34  | 0 | 1  | 0 | -1 | -0.77 | 18.27  | -1 | 0 | 1  | 0 |  |
| 29 | -0.29 | 48.43  | 0 | -1 | 0 | 1  | -0.96 | 14.79  | -1 | 0 | 1  | 0 | 85.310 |
| 30 | -0.96 | 14.77  | 0 | -1 | 0 | 1  | -0.29 | 49.01  | -1 | 0 | 1  | 0 | 84.076 |
| 31 | -0.77 | 18.32  | 0 | -1 | 0 | 1  | 0.64  | 22.24  | 1  | 0 | -1 | 0 |  |

FIG. 22

VIRTUAL WEAVER ARCHITECTURE FILTER

CROSS-REFERENCE TO RELATED APPLICATIONS

This application is a 35 USC §371 application of International Application No. PCT/CA2009/001817 filed Dec. 11, 2009, which is hereby incorporated by reference in its entirety.

FIELD OF THE INVENTION

This invention relates to signal processing. More particularly, this invention relates to the design of analog circuit effectively providing a quadrature-matched pair of mixers that are useful in implementing a virtual Weaver architecture filter.

BACKGROUND OF THE INVENTION

The various architectures of radio receivers find their origins in exceptional is innovations of the early part of the 20$^{th}$ century; some indeed can be traced to the latter years of the 19$^{th}$ century. Radio communications are based upon the observation that electro-magnetic energy is capable of radiating into empty space as a constant exchange of magnetic and electrical energy. An oscillating electrical signal in a conducting material creates such radiation, to a greater or lesser degree dependent upon the so called "matching" of the conducting material to the frequency of oscillation, and when such radiation impinges upon another suitable material it induces current or voltage oscillations in that material, again to a greater or lesser extent depending on the matching. This induced signal is very small, as perhaps can be appreciated by the fact that the solid angle subtended by the receiving material relative to the transmitting material can be very small indeed, and so the percentage of energy collectable in even an ideal system is tiny.

The physicist is inclined to consider the operation of a radio receiver as a thermodynamic device, inquiring into the total energy representing the signal at the receiver, and asking to what degree this signal exceeds the thermal noise present due to the finite temperature of the environment. All energy storage means are coupled to the ambient temperature of the environment as is well understood from the 19$^{th}$ century study of thermodynamics. Hence they all acquire a certain amount of energy within a given bandwidth and the wanted signal is additive to this thermal noise. The extent to which the signal exceeds the noise is the signal-to-noise ratio.

Thermal noise exists in equal amounts across all possible frequencies of the oscillation of voltage or current. Indeed, one of the outstanding conclusions of thermodynamics is the 'equipartition of energy' theorem which states that there will be an equal quantity of energy in each possible bandwidth of radio receiver. Hence the total magnitude of thermal noise is assessed by summing over all frequencies of signal that are present at the receiver. This last observation of the physicist is key to the engineer's design of a radio: the signal can be distinguished from the noise to a much higher degree if the bandwidth of the received signal is restricted. That is to say, if the engineer is able to make the radio receiver neglect all those frequencies that are not part of the desired signal, then the total noise will be less, since the noise must be added for every frequency present at the receiver output. This aspect of the radio is called its "selectivity" and is critical in the separation of the signal from the noise. Higher selectivity means higher performance, lower noise, and better fidelity. We can view the progress of radio design from the late 19$^{th}$ century to early 21$^{st}$ century as a continual improvement of selectivity in particular, and a deepening understanding of noise in a communication channel in general.

How then is selectivity achieved in a radio receiver? The answer is via use of electronic amplification of certain narrow bandwidths of interest and suppression of out-of-band frequencies. The optimum elemental device to achieve this is the tuned circuit: a combination of inductance and capacitance that exhibits simple harmonic motion as energy is exchanged from the electric field of the capacitor to the magnetic field of the inductor and vice-versa. Consequently, the conceptually simplest viable radio receiver is of the so-called "tuned RF" type that arranges for a high Q circuit to amplify the desired signal frequency as much as possible and rapidly roll off its response to signals of any other frequency. However, the tuned RF receiver suffers from a practical difficulty: in order to change the received frequency this tuned circuit must be changed, involving somehow adjusting the value of the inductor and/or capacitor, a task that is not impossible, but is inconvenient and somewhat costly. It would be far more convenient and less costly if the selectivity were always provided at a fixed frequency; a seemingly to impossible task since the received frequency is required to change as different radio stations are selected.

This conundrum is solved by the heterodyne principle invented in the latter years of the 19$^{th}$ century, whereby the desired power of the received signal is shifted in frequency to a constant intermediate frequency and selectivity is achieved by circuit elements working at this fixed intermediate frequency. Specifically, the received signal at the desired frequency of reception is caused to interact with a signal generated locally in the receiver in such a way as to produce a third frequency, the intermediate frequency. In fact, the heterodyne principle necessarily generates two output frequencies: one at 'frec+flo' and one at 'frec−flo' where 'free is the received frequency and to' is the local oscillator frequency. The "interaction" of local oscillator and received signal is ideally multiplication and the electronic element that achieves this multiplication is called a "mixer".

It is further arranged that the locally generated signal, the local oscillator, is adjustable in frequency of oscillation and so is able to transform any of a range of received frequencies to the same intermediate frequency. Selectivity is provided at the fixed intermediate frequency by components that need not change; the choice of frequency to receive is set by the adjustable local oscillator. This heterodyne principle, or more precisely a variant of it that selects only one of the two heterodyne frequencies (typically the difference frequency 'frec−flo'), the so called "super-heterodyne" receiver, has come to dominate: it is ubiquitous in all applications of radio communication.

But, this domination of the super-heterodyne radio comes at a cost in a common class of radio applications: there are situations where two distinctly different received frequencies generate the same intermediate frequency. That is, there are circumstances where the super-heterodyne radio cannot resolve a single received frequency and so is susceptible to unwanted interference from a second radio transmitter if it happens to be at that second frequency. This inseparable second frequency is commonly called the "image frequency" and the super-heterodyne must be augmented by additional circuitry to discriminate between the image and the real received frequency.

This augmentation turns out to be far from trivial and its solution had to await the is invention of the "Single Sideband Modulator" by Hartley in 1925 (see U.S. Pat. No. 1,666,206)

which, although directed to a somewhat different task, nevertheless showed the principle by which the image may be removed after the mixing process. The Hartley image rejection receiver operates by recognizing that the phase of the image and the real frequencies differ, and, by use of a suitable phase shifting network, illustrated in FIG. 1, a vector-sum cancellation may be achieved that removes the image. Consequently, if that "suitable phase shifting network" can be made we have removed the remaining obstacle to the universal use of the super-heterodyne receiver.

As the reader may have guessed, the "suitable phase shifting network" is itself not perfect: it is probably impossible to make a fixed phase shift over more than a narrow range of frequencies and the Hartley image rejection method is limited by the difficulty of making a wide frequency range phase shifting circuit.

In 1956 Donald Weaver described what has become known as the Weaver architecture for image rejection in his paper entitled "A third method of generation and detection of single-sideband signals", D. K. Weaver—Proc. IRE, 1956. The first method implied in Weaver's title is the filter used prior to Hartley; the second method is Hartley's method. Illustrated in FIG. 2, Weaver's method relies upon two sets of mixers; each set is called a quadrature modulator because it multiplies the signal by a local oscillator that has not one but two outputs. The two outputs are in quadrature to each other—they are 90 degrees apart in phase. Through a series of trigonometric identities Weaver shows that a frequency shift as required in the heterodyne receiver can be accomplished with the additional feature that the image frequency is removed. Clearly set out in his paper, the effect of two sets of quadrature mixers in sequence are shown in mathematical detail and the result is inescapable: assuming the mixers are indeed in quadrature and that the intermediate signals are filtered to remove the upper of the mixed frequencies then no image can be present in the output. Unlike the Hartley approach, the Weaver circuit is implementable without approximation, and it operates over unlimited bandwidth since no phase shift network is needed.

Weaver's architecture has been successful. Modern digital radios (cell phones, TV receivers, etc.) use his architecture and achieve image rejection to an adequate degree. The Weaver architecture, limited only by the quadrature nature of the signals, can reject an image by about 50 db (about 1 part in 300). Various digital enhancements can, with advanced signal processing in the digital domain, improve image rejection to perhaps 60 db (1 part in 1000).

However, a reading of Weaver's paper will show that his architecture requires that the signal flowing from the first set of mixers to the second must be filtered: the sum frequency must be removed. This signal flow is in two parts, one signal flows from one of the first mixers to one of the second mixers, and a second signal flows between the remaining two mixers. It is within this dual signal path that the required filters must be placed to block the sum frequency. Recall that the image rejection of the architecture relies upon the quadrature nature of the signals—they must be 90 degrees apart—to a high degree. Even as little as a one degree phase difference will limit the ultimate image rejection to less than 60 db. It is quickly realized therefore that the two filters that are required to be placed in the two signal paths must match such that the phase difference between them is substantially less than one degree to retain the best image rejection. This is difficult: the two filters will limit the image rejection unless they match to a very high degree. A means of overcoming this limitation is the subject of the present disclosure.

If an analog circuit could create a matched pair of filters, then the relative expense and power consumed by the only other known solution to improve matching, namely conversion into the digital signal processing domain, could be avoided.

This disclosure first teaches how to make a Weaver architecture radio where no filter is required between the first and second set of mixers. Hence no phase error is incurred and image rejection is substantially higher than can be achieved by any analog implementation of the conventional Weaver architecture.

In addition to the absence of filters, this disclosure documents a second innovation: the use of a time-division multiplexed second set of mixers, again aimed at the improvement of image rejection.

It is clear that matching of the second set of mixers as well as the filter matching will affect image rejection—the second set of mixers may not be precisely in quadrature to each other. This is why many modern radio receivers place ADC's (analog to digital converters) after the first mixers and accomplish the second mixing in the digital domain. Once in the digital domain algorithms exist to digitally correct any phase difference in the two paths. In a digital implementation it is possible to time-division multiplex since the state of the digital filter can be restored upon switching the multiplexer. In Weaver's architecture implemented in the analog domain it is not possible to time-division multiplex the second set of mixers due to the need for filtering because time division multiplexing destroys the action of the filter. The filter sees a high speed signal as it must handle the two signals in sequence. Therefore, the signal seen by the filter is not the actual first mixer output—it is a chopped version of it. This cannot be filtered without maintaining separate state-variables for each part of the time division multiplexer. However, when the first innovation is employed no filter is necessary—and in this case time-division multiplexing in the analog domain can be used. This enables the design of a single circuit representing both of the second mixers, wherein no phase error is introduced and image rejection is enhanced.

The objects of the invention will be better understood by reference to the detailed description of the preferred embodiment which follows. Note that not all of the objects or advantages implied by this disclosure are necessarily met by all embodiments of the invention described below or by the invention defined in each of the claims.

SUMMARY OF THE INVENTION

The invention relies upon the use of a sampling mixer ("DSM") of the general type disclosed in Mallinson, U.S. Pat. No. 7,028,070 as the first set of mixers. The sampling mixer in question is an analog circuit capable of the act of mixing and the generation of accurate quadrature signals. The disclosure will show how a certain configuration of such a DSM can eliminate the need for a filter and yet be able to implement the Weaver trigonometric identities and remove the image.

In one of its aspects, the invention comprises a sampling mixer having a parallel array of processing elements, each of the elements comprising a sampling circuit for sampling an input signal. The array is configured such that each processing element successively processes respective samples of the input signal in round-robin fashion. Filter means are provided in the array. Each multiplier of a set of multiplier circuits multiplies an output of respective ones of the processing elements, the set providing a summed output.

In another aspect of the invention, the filter means comprises a filter interposed between each of the sampling circuits and respective ones of the multiplier circuits.

In a further aspect of the invention, the filter means includes a resistance shared by the inputs of each of the sampling circuits.

In another aspect, the invention comprises a processor for a radio frequency signal. Each member of a first pair of quadrature mixers operates on the same samples of the signal, with a second pair of quadrature mixers operating on the is outputs of respective ones of the first mixers. The first pair of mixers comprises a parallel array of sampling circuits configured to operate in round-robin fashion to sample the signal. A first and a second multipliers operate on the outputs of each of said sampling circuits and a plurality of such first multipliers have scaling factors selected to emulate the in-phase output of a local oscillator and a plurality of the second multipliers have scaling factors selected to emulate the quadrature output of a local oscillator.

In another aspect the first pair of quadrature mixers comprises filter means and in a more specific aspect, the filter means comprises a series of filters between each of the sampling circuits and a common input of respective first and second multipliers. In yet a more specific aspect, the filter means includes a resistance shared by the inputs of each of the sampling circuits.

In a further aspect of the invention, the foregoing processor scaling factors of one of the multipliers emulates a sinusoidal waveform and the scaling factors of the other of the multipliers emulates the same sinusoidal waveform out of phase by 90 degrees.

In yet another aspect, the invention comprises a circuit implementing an analog quadrature-matched pair of mixers. Each element of a parallel array of processing elements comprises a sampling circuit for sampling an input signal. The array is configured such that each processing element successively processes respective samples of the input signal in round-robin fashion. There are two sets of multiplier circuits, each multiplier circuit multiplying an output of respective ones of the processing elements by a scaling factor, and each of the sets provide a summed output. The successive multiplier circuits of a first one of the sets has scaling factors that correspond to the coefficients in a Fourier series approximation of a sinusoidal waveform and the successive multiplier circuits of the second one of said sets has scaling factors that correspond to the coefficients in a Fourier series approximation of said sinusoidal waveform out of phase by 90 degrees.

In another aspect of the preceding circuit, the array comprises filter means, and in a more specific aspect, a filter is interposed between each of the sampling circuits and respective ones of the multiplier circuits. In a yet more specific aspect, the filter means includes a resistance shared by the inputs of each of the sampling circuits.

The invention further contemplates the use of the foregoing circuit in implementing the first pair of mixers in a Weaver architecture filter.

In a method aspect, the invention comprises a method of filtering a radio frequency signal to reject an image frequency. The method comprises procuring a successive series of samples of the signal, filtering each of the samples to produce filtered samples and successively multiplying each of the filtered samples by, on the one hand, a first plurality of respective scaling factors corresponding to the coefficients in a Fourier series approximation of a sinusoidal waveform, and on the other hand a second plurality of scaling factors corresponding to said coefficients representing a quadrature of said sinusoidal waveform. The outputs of the multiplications are summed.

In another aspect the invention comprises a circuit for processing a radio frequency input signal to achieve image rejection. Switching means are provided for selecting between four sets of multiplier scaling factors. The sets correspond to the coefficients of a Fourier series approximation of a sinusoidal signal, the inverse of said sinusoidal signal, a cosine of said sinusoidal signal and the inverse of said cosine respectively. Each of the sets of scaling factors are applied to samples of the input signal to produce multiplied outputs and a summing circuit sequentially sums the outputs of each of the sets.

In another aspect, the invention comprises a circuit for processing a radio frequency input signal to achieve image rejection. The circuit comprises a parallel array of processing elements with sampling circuits for securing a plurality of samples of the signal. Means are provided to sequentially process each of the processing elements and for filtering the outputs of the sampling circuits. Each of the processing elements comprises an input switch, a capacitance associated with the input switch and two resistors each of which is selectively switchable to a first virtual ground amplifier, a second virtual ground amplifier or ground, the output of the processing element being defined as the difference between the outputs of the first and second virtual amplifiers. A circuit sums the outputs of the processing elements.

In a more specific aspect, the means for filtering of the preceding circuit includes a resistance shared by the inputs of the processing elements.

The foregoing was intended as a broad summary only and of only some of the aspects of the invention. It was not intended to define the limits or requirements of the invention. Other aspects of the invention will be appreciated by reference to the detailed description of the preferred embodiment and to the claims.

BRIEF DESCRIPTION OF THE DRAWINGS

The invention will be described by reference to the detailed description of the preferred embodiment and to the drawings thereof in which.

DETAILED DESCRIPTION OF THE PREFERRED EMBODIMENT

Figure 3:
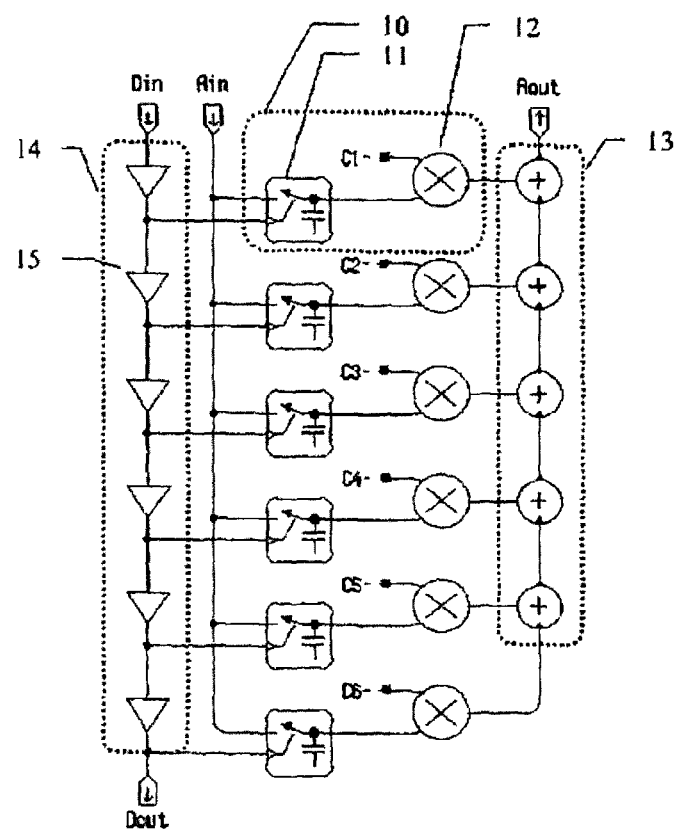
FIG. 3 is a circuit diagram of a prior art round-robin sampling mixer.

One version of Weaver architecture implements the first set of mixers with a sampling mixer (DSM) of the general type shown in U.S. Pat. No. 7,028,070, which is incorporated herein by reference. Such a DSM is based on a sum-of-products circuit and so capable of implementing the mathematic operation $$y = \sum_{i=1}^{N} x_i \cdot w_i$$

where 'y' is the output, 'x' is a set of input parameters and 'w' a set of weighting factors. Fundamental to the DSM is that the set of input parameters 'x' are the 'round-robin' samples of an input signal. Referring to FIG. 3 (which is FIG. 1 of U.S. Pat. No. 7,028,070), a parallel array of sample and hold circuits 11 are activated in round-robin fashion (in this example by the delay line 14) to successively process samples of the input signal and present their outputs to respective multipliers 12 each having a scaling factor Cn. A summing network 13 then adds all such products of coefficients (Cn) and samples to a common output (Aout). The absence of rotation of the coefficients causes the circuit to operate as a correlator, multiplying the input signal by a virtual wave of successive coefficient values (corresponding to the coefficients of a Fourier series approximation of a sinusoidal waveform) and performing a running average over the results. That running average may alternately be described as a "box car" filter or rectangular filter and results in the well known sin(x)/x response.

Figure 4:
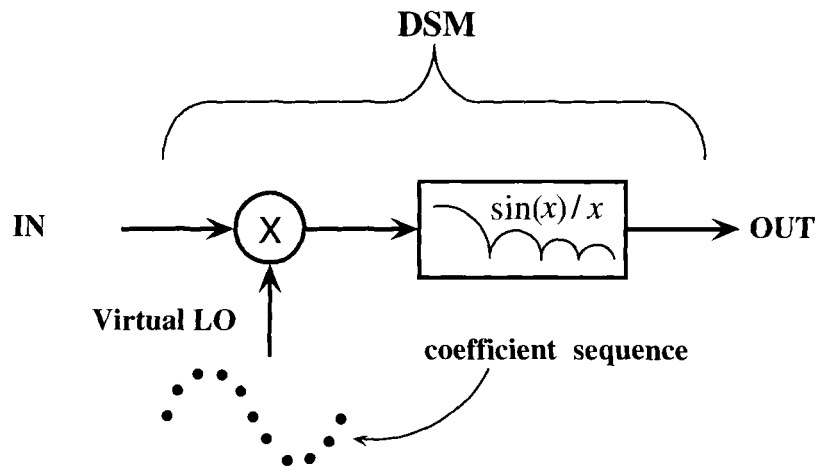
FIG. 4 is an alternative diagrammatic representation of the circuit of FIG. 3.
Figure 5:
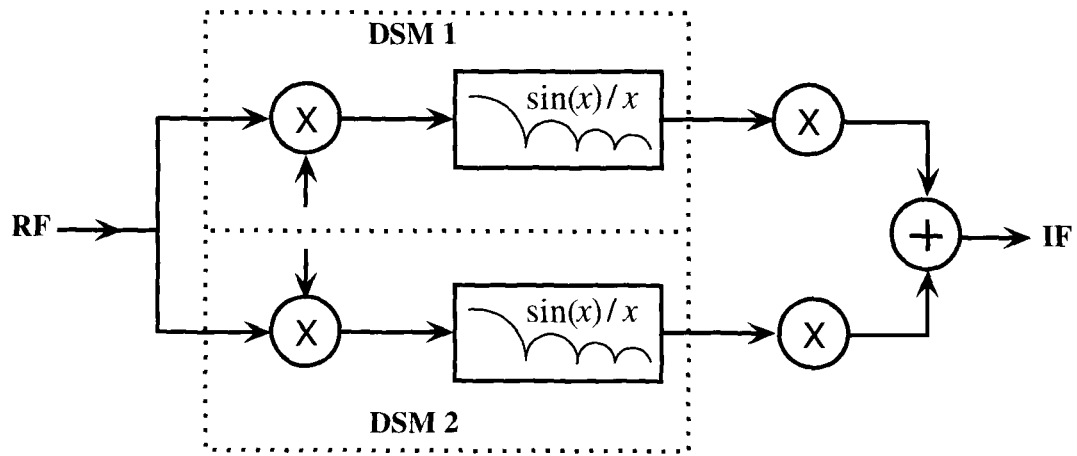
FIG. 5 is a schematic diagram of an approximation of the Weaver architecture filter using a pair of round-robin sampling mixers.

The DSM system can be represented as shown in FIG. 4. A multiplication of the input with a succession of coefficient values and the filtering of that multiplication output via a sin(x)/x filter. FIG. 4 already resembles the first part of the Weaver circuit, and we can draw two DSM circuits and their associated filters used in the Weaver architecture as shown in FIG. 5. Clearly the sin(x)/x filter is in the correct place and if it could function as the required low pass filter it would match each other very well, better than two separate analog filters since these sin(x)/x filters arise from the time taken to complete one round-robin sample and so are related to the clock. However, despite being in the correct place and being matched, the sin(x)/x response is not sufficient to adequately remove the upper product (i.e. the 'frec'+'flo' signal) because apart from the zeros of the transmission it is essentially a first order filter.

Figure 6:
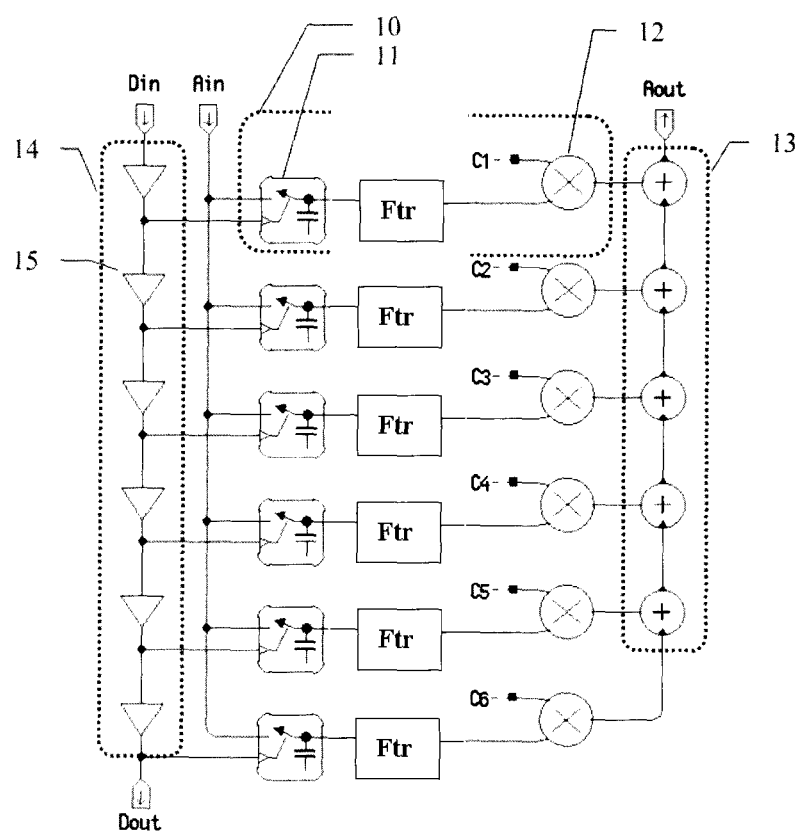
FIG. 6 is a circuit diagram of a round-robin sampling mixer including a set of filters between the sample and hold devices and the multipliers, according to an embodiment of the invention.

The first innovation addresses this problem of the poor performance of the sin(x)/x filter and its inability to perform the required Weaver filter action as shown in FIG. 6. This represents a modification of FIG. 3 in that a new block, a filter (Ftr), is inserted at the sample and hold output prior to the multiplication. This filter is nominally identical in all channels, but need not be precisely so.

Figure 7:
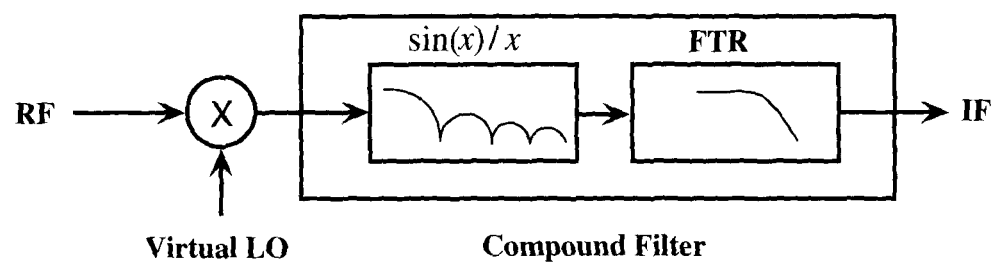
FIG. 7 is a diagrammatic representation of an equivalent configuration of the circuit of FIG. 6.

The effect of placing this filter in this position is to compound the existing sin(x)/x filter with this filter since multiplication and summation are linear operations, the filter is indistinguishable from a filter placed in series with the sin(x)/x filter as illustrated in FIG. 7. Therefore, by placing as many copies of a filter as there are coefficients after the sample and hold, we have created an apparently steeper (more effective) filter in series with the sin(x)/x filter.

Figure 1:
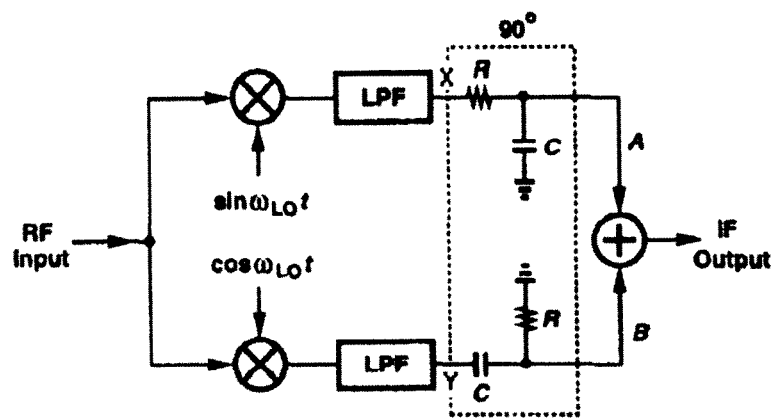
FIG. 1 is a circuit diagram of a prior art Hartley image rejection receiver.
Figure 2:
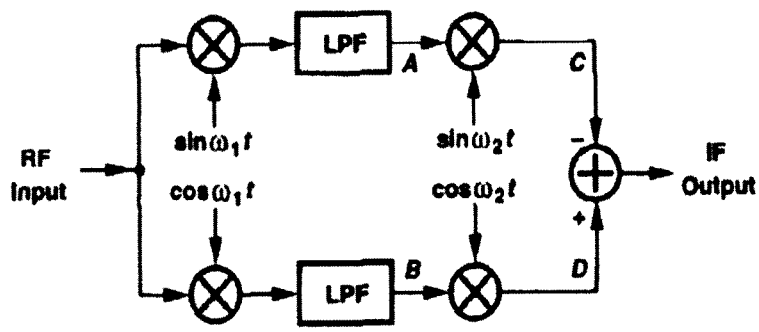
FIG. 2 is a circuit diagram of a prior art Weaver image rejection receiver.
Figure 8:
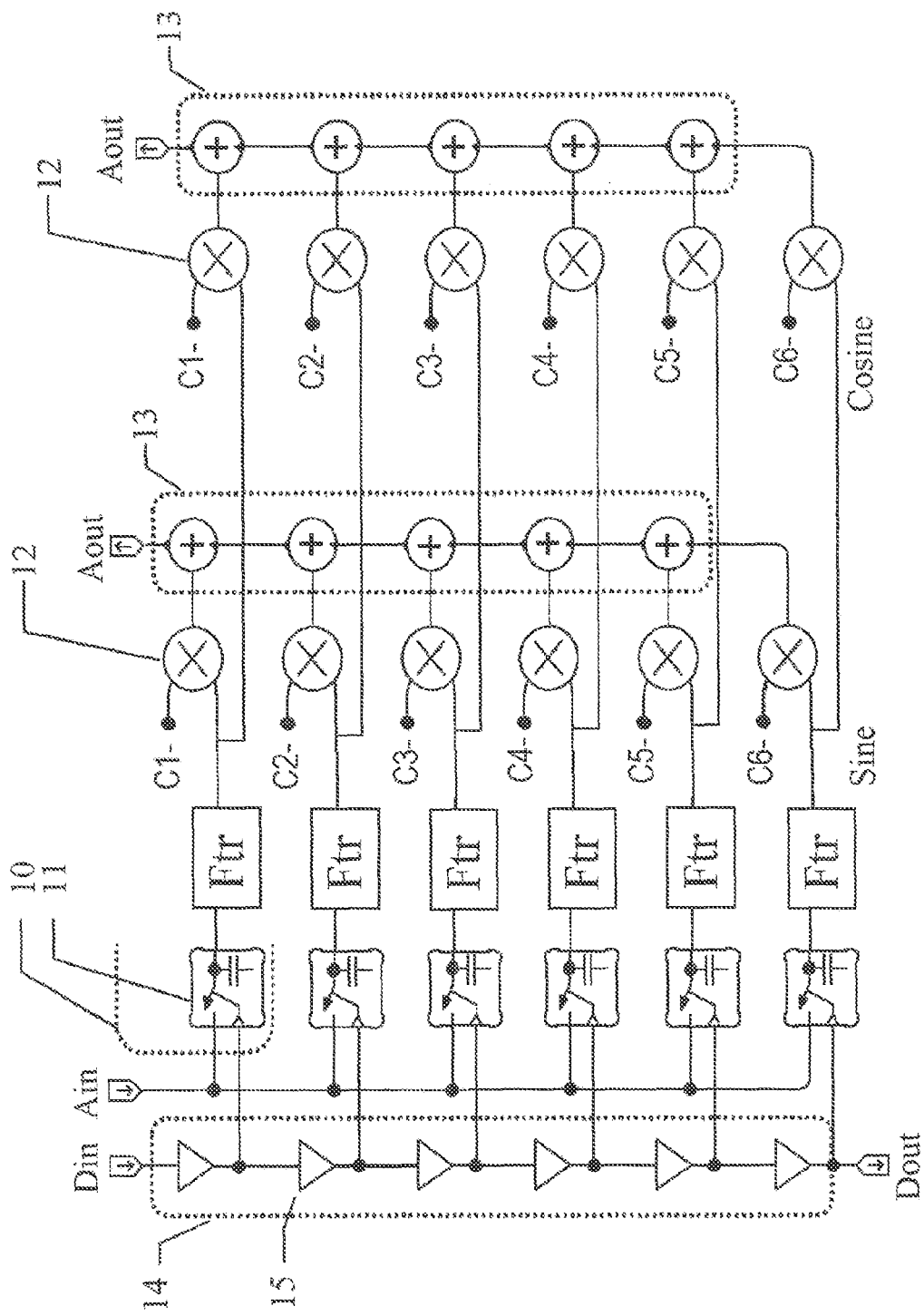
FIG. 8 is a circuit diagram of a round-robin sampling mixer with filters interposed between the sample and hold devices and the multipliers according to an embodiment of the invention.

At this point in the development of the idea this seems a very inefficient suggestion: we may as well have added just one filter at the output rather than what could be as many as 100 filters after the sample and hold. However, not one but two DSM's are needed in the Weaver architecture and these two DSM's can be made to share the same set of sample and hold and filters. This is done as shown in FIG. 8.

is In comparison to the filter shown in FIG. 1 of U.S. Pat. No. 7,028,070, FIG. 8 shows how two sets of coefficients, one encoding a sine wave and one encoding a 90 degree shift sine wave (i.e. a cosine) to emulate the quadrature outputs of a local oscillator can share the same set of sample and hold and filters. Note that the coefficients Cn in the Sine and Cosine blocks are not the same: for example, C1 in the Sine block is not equal to C1 in the Cosine block. Now the benefit should be obvious: both the upper and lower branch of the Weaver architecture see the same filter—they both see the filter action of the filters after the sample and hold circuit and so experience identical and perfectly matched filters. Consequently, the image rejection is not lost by any filter mismatch.

Implementing time division multiplexing of the Weaver architecture is the second of the innovations disclosed herein and builds upon the first innovation, namely the removal of any additional filtering from the two arms of the Weaver architecture and the insertion of filters prior to the multiplier in the DSM.

Figure 9:
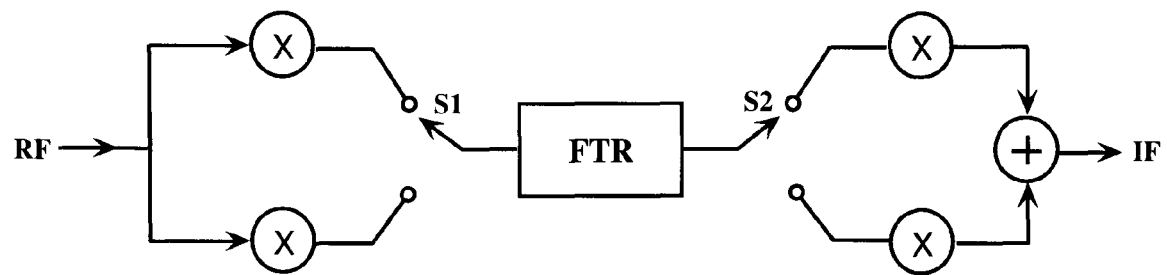
FIG. 9 is a diagrammatic representation of how one might seek to implement time division multiplexing in a Weaver filter.

First let us discuss why the conventional Weaver architecture cannot be multiplexed. FIG. 9 shows an obvious way that we may attempt this: the filter first gets used in the upper path, then in the lower path and so forth. Since it is the same filter it clearly matches. The problem is that this switching action requires the filter to handle first the upper path and the internal state variables begin to respond to that signal, then the lower path and the internal state variables begin to respond to that signal. Consequently the filter never settles and cannot perform the filtering action. It simply is not possible to multiplex an analog filter: its operation depends on the time evolution of the internal state variables when a continuous signal, not when a multiplex signal is applied at the input. A more common description of the foregoing is that the presence of the multiplexer is itself another frequency shifting multiplier and moves the baseband signal out of the filter characteristic.

Figure 10:
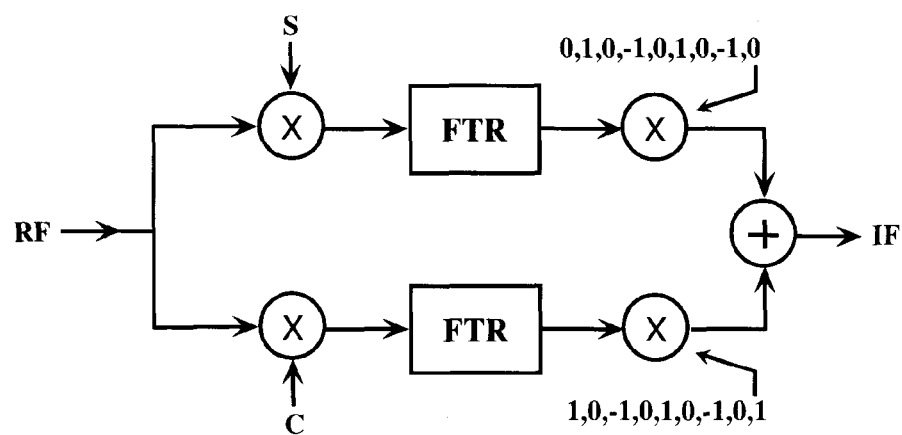
FIG. 10 is a diagrammatic representation of a time quantized version of the second set of multipliers of FIG. 9 according to an embodiment of the invention.
Figure 11:
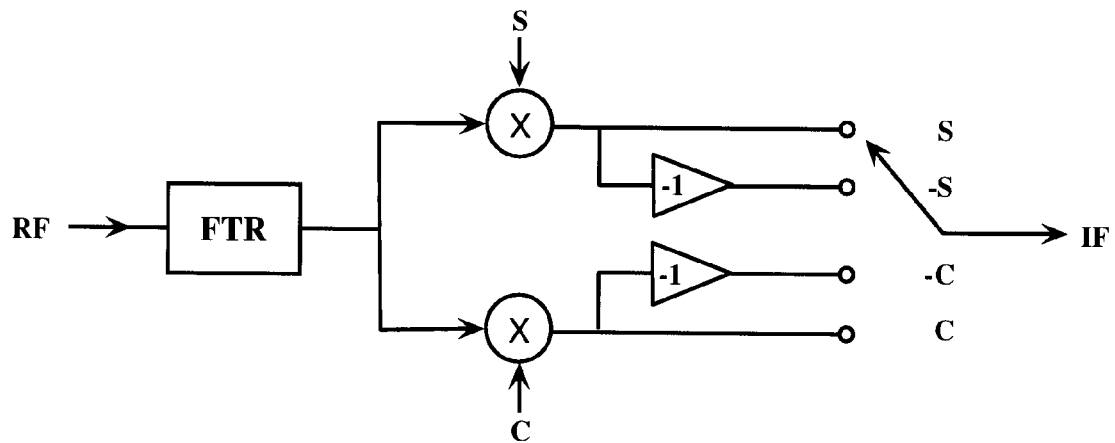
FIG. 11 is a diagrammatic representation of the approach of FIG. 10, further resolved to apply a single quantization process to both of the second multipliers.

Even though that simple technique will not work, we can begin a series of changes to the Weaver architecture that ultimately does lead to the equivalent of a multiplexed solution. We begin by quantizing in time the action of the second set of multipliers (the reader will realize that this corresponds to quantizing the summed output). Rather than apply a continuous sinusoidal signal we apply the following sequence of three-level signals. To the upper multiplier we apply 0, 1, 0, −1, 0, 1, 0, −1, . . . etc. and to the lower we apply 1, 0, −1, 0, 1, 0, −1, 0, . . . etc. as shown in FIG. 10. These sequences are simply three level encoded sine and cosine signals sampled at four times the sine and cosine frequency. They exhibit an interesting property: when one multiplier is active, i.e. generating a non-zero output, the other is inactive, i.e. generating a zero output. We seem to not need both at the same time. In fact, we don't even need them at all, since the circuit shown in FIG. 11 is clearly identical in operation.

The one-of-four selector switch applies either the upper path directly or inverted, or the lower path directly or inverted. It is noted that in FIG. 11, the filter has been moved to the input as discussed in the innovation earlier in this disclosure. However, it is important to realize that this drawing is over simplified in its use of that filter prior to the multiplication: this works when the invention as described earlier is used.

To summarize at this point: two things are going on here: first, the use of the filter in the DSM that makes the first pair of multipliers (shown schematically as being prior to the sine and cosine multiplication); second, the encoding of the second multipliers into three levels and sampled at four times the rate of the second mixing. Only a one-of-four selector is needed to replace the entire second quadrature multiplication and summation.

Figure 12:
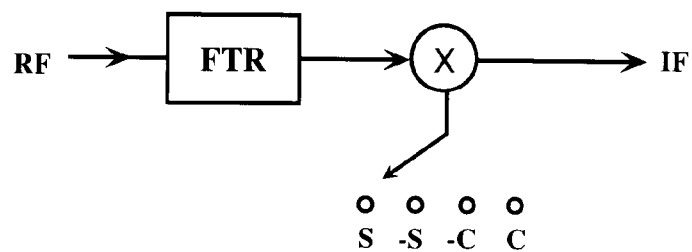
FIG. 12 is a diagrammatic representation of the approach of FIG. 11, further resolved for the case where the coefficients of the round-robin sampling mixer are adjustable.

This is interesting and useful, but it can be simplified even further if the coefficients of the DSM can be changed. In the same way that we did not need the two output multipliers at the same time, the above drawing shows we do not need the input multipliers at the same time. Assuming a DSM with adjustable coefficients is available only the circuit of FIG. 12 is needed. A switch selects one of four different coefficient sets; these are just sine and cosine sets and their inverses. The order of selection is 'c' followed by 's' followed by '−c' followed by '−s' etc.

The output IF frequency is indistinguishable from that which would originate in a Weaver architecture radio with very well matched sine and cosine channels. No image is present in the output and the signal between the input and output multipliers of the Weaver do not exist in this implementation.

The following further description details additional elements of the preferred embodiments described above such that a clear and working example of the disclosed invention may be presented.

Figure 13:
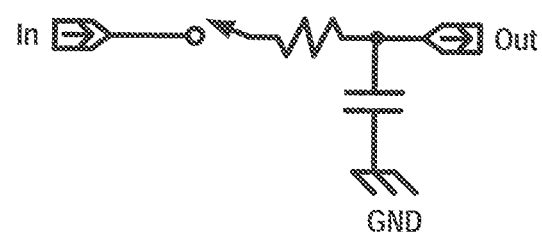
FIG. 13 is a circuit diagram of a filter implemented as a series resistance in the sampling capacitor according to the preferred embodiment of the invention.

The Virtual Weaver circuit depends upon the presence of a filter in each of the DSM sampling sections. The simplest form of such a filter can be created by a series resistance in the sampling capacitor as shown in FIG. 13. In this case when the switch closes to sample the input the bandwidth is limited to ½πRC.

Figure 14:
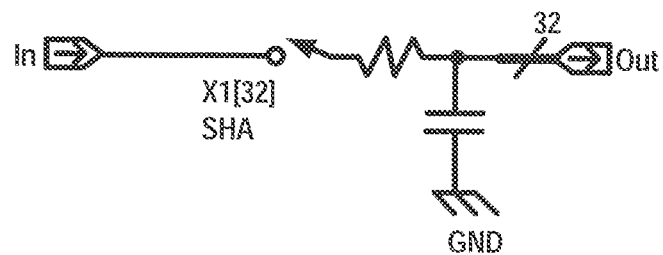
FIG. 14 is a circuit diagram showing an exemplary notation for iterations of sample and hold devices according to the preferred embodiment.
Figure 15:
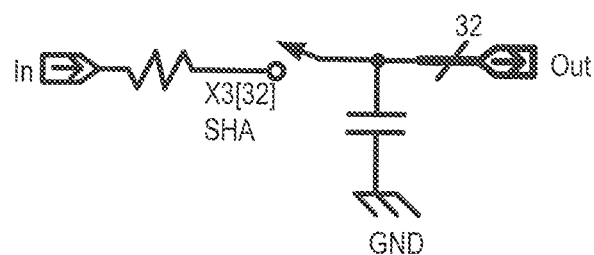
FIG. 15 is a circuit diagram of an alternative to the circuit of FIG. 14 implemented according to the preferred embodiment.

In the DSM there are many more than one sample and hold, and we may choose to represent the multiple sample and hold devices (SHA) by using a feature of the schematic drawing shown in FIG. 14. The grey outline shows the internal components but because the name is X1[32] there are 32 instances of the contents of the grey outlines. On the left, only one wire enters all 32 instances and so is connected to all of them in parallel, whereas on the right 32 wires enter the 32 instances and so are connected one to one—that is, the 32 wires on the right are from each of the individual instances. This method of drawing allows us to represent complex groups of many components. Each of the switches will be closed and re-opened in turn in order to make a continuous "round robin" series of samples. However, a simplification of this circuit is possible: since the switches are closed one at a time, we note that any given resistor only takes current when the switch is closed and the circuit of FIG. 15 therefore performs the same task: we only need one resistor for the whole array of SHA's.

Figure 16:
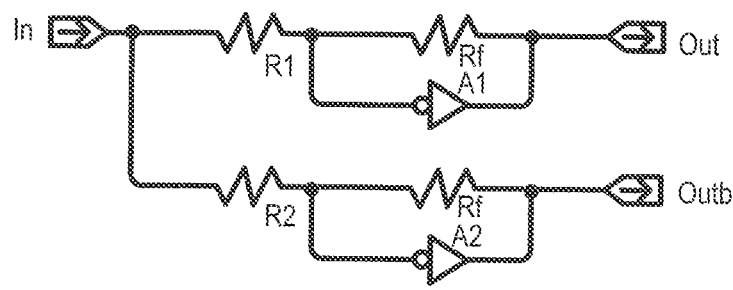
FIG. 16 is a circuit diagram of a summing element to sum to a virtual ground according to the preferred embodiment.

We now need to configure the DSM to output the weighted sum of multiplication by a sine wave and we will accomplish this by using resistors on the output summing to a virtual ground as shown in FIG. 16. If we use two output amplifiers (shown as A1 and A2 representing inverting virtual ground amplifiers) we can create the effect of a negative coefficient— here are shown two output amplifiers and the output signal is taken to be the voltage difference between 'Out' and 'Outb'. The equation describing the output is:

$$V(\text{out, outb}) = V(\text{in}) \cdot Rf \cdot \left[\frac{1}{R2} - \frac{1}{R1}\right]$$

We see that we can get a positive or negative multiplication of V(in) depending upon the relative values of R1 and R2. Consequently, this circuit implements the weighted sum of the DSM samples with either positive or negative coefficient values depending upon how R1 and R2 are defined within each repeated cell. The equations to define R1 and R2 are:

$$R1_i = \begin{cases} X_i \geq 0 \to \infty \\ X_i < 0 \to 1/X_i \end{cases} \quad R2_i = \begin{cases} X_i > 0 \to 1/X_i \\ X_i \leq 0 \to \infty \end{cases}$$

where Xi are the coefficient values and R1i and R2i are the resistors in the cell connected as in the above prototype. In this equation and in all that follow, a practical limitation is apparent: as Xi more closely approaches zero but does not quite reach zero, the required R increases in value. High values can be impractical and consequently a reasonable maximum value of, for example, 2 MOhms could be applied.

Figure 17:
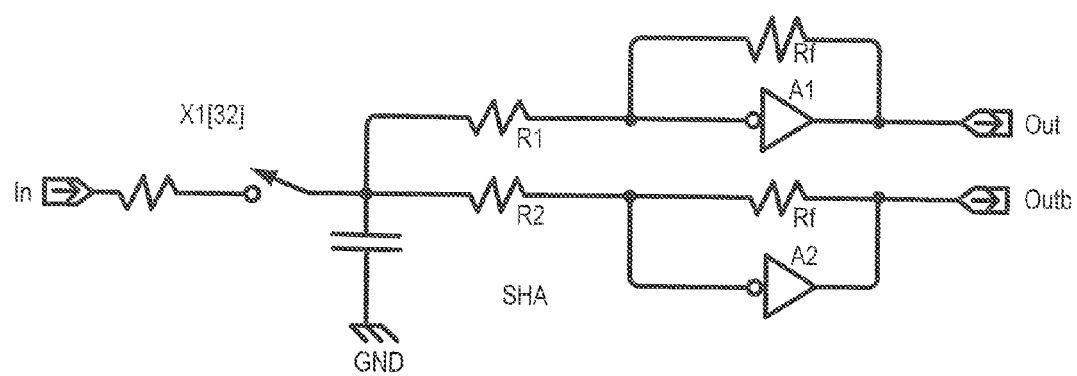
FIG. 17 is a circuit diagram of the round-robin sampling mixer according to an embodiment of the invention for one set of coefficients.

The implementation shown in FIG. 17 then is the almost complete circuit of the is DSM with one set of coefficients. In FIG. 17, the values of R1 and R2 differ in the repeated block: if the desired coefficients are the Xi then the equations above show how to set the internal R1 and R2 values for each instance indexed by T. This circuit, despite its simplicity, is quite viable if we make one more addition. Note that as drawn above the load on the sampling capacitor will vary as the coefficient varies. If we can make that load constant, then we can make this simple all-passive circuit work. We will arrange that the input resistor that limits the bandwidth is for example, 1 k. And we will arrange that the load on the capacitor is always, for example, 10 k. In this case we suffer approximately 10% signal attenuation but otherwise the circuit still operates.

Figure 18:
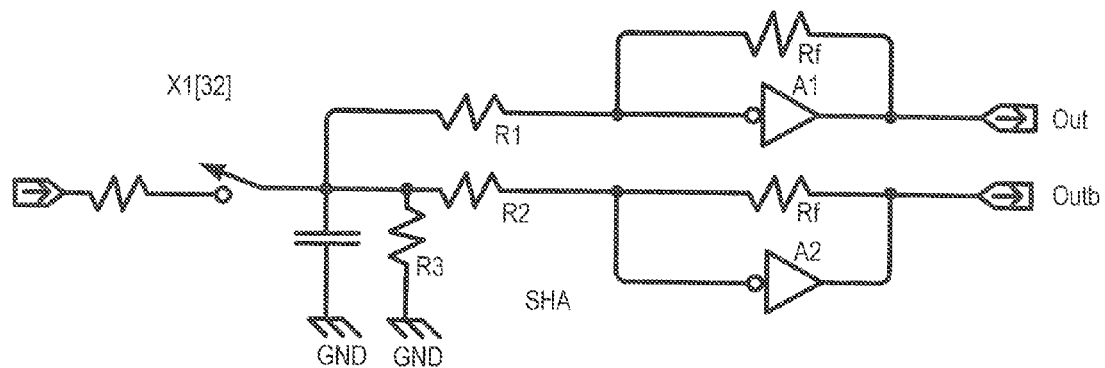
FIG. 18 is a modification of the circuit of FIG. 17 according to an embodiment of the invention.

The circuit of FIG. 18 adds another resistor R3 to the repeated block. The equations for the generation of R1, R2 and R3 then become:

$$R1_i = \begin{cases} X_i \geq 0 \rightarrow \infty \\ X_i < 0 \rightarrow 1/X_i \end{cases} \quad R2_i = \begin{cases} X_i > 0 \rightarrow 1/X_i \\ X_i \leq 0 \rightarrow \infty \end{cases} \quad R3 = \frac{1}{\frac{1}{RT} - \frac{1}{R1} - \frac{1}{R2}}$$

We see that R3 is constructed such that the load is always RT on the capacitor. Given these definitions this circuit is the complete band limited DSM with a single set of coefficients.

Figure 19:
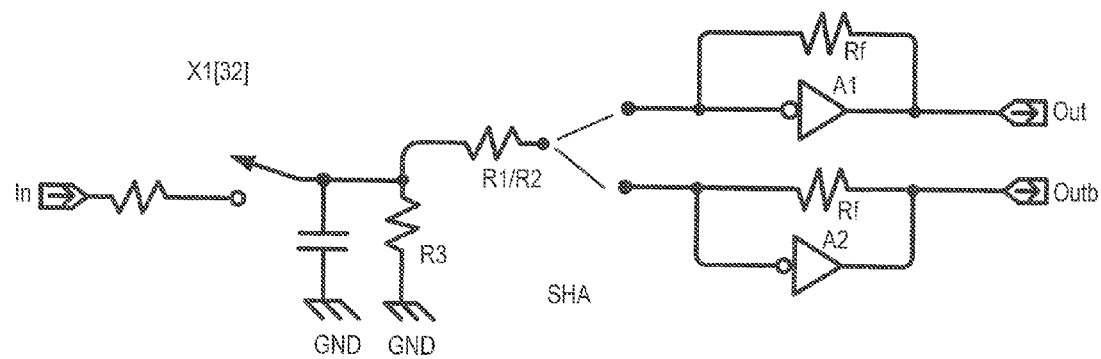
FIG. 19 is a modification of the circuit of FIG. 18 according to an embodiment of the invention to select between two coefficients.

Again it is worth mentioning that this circuit operates because the values of R1, R2 and R3 in each of the 32 instances of 'SHA' are different; they differ as described by the equations on the top of the page. And furthermore, there are only ever actually two, not three, resistors in any given instance—one of the resistors R1 or R2 is always infinite, and hence non-existent in each cell. A single variable value resistor connected in one of two possible configurations is sufficient to make either R1 or R2 as required, as illustrated in FIG. 19.

Figure 20:
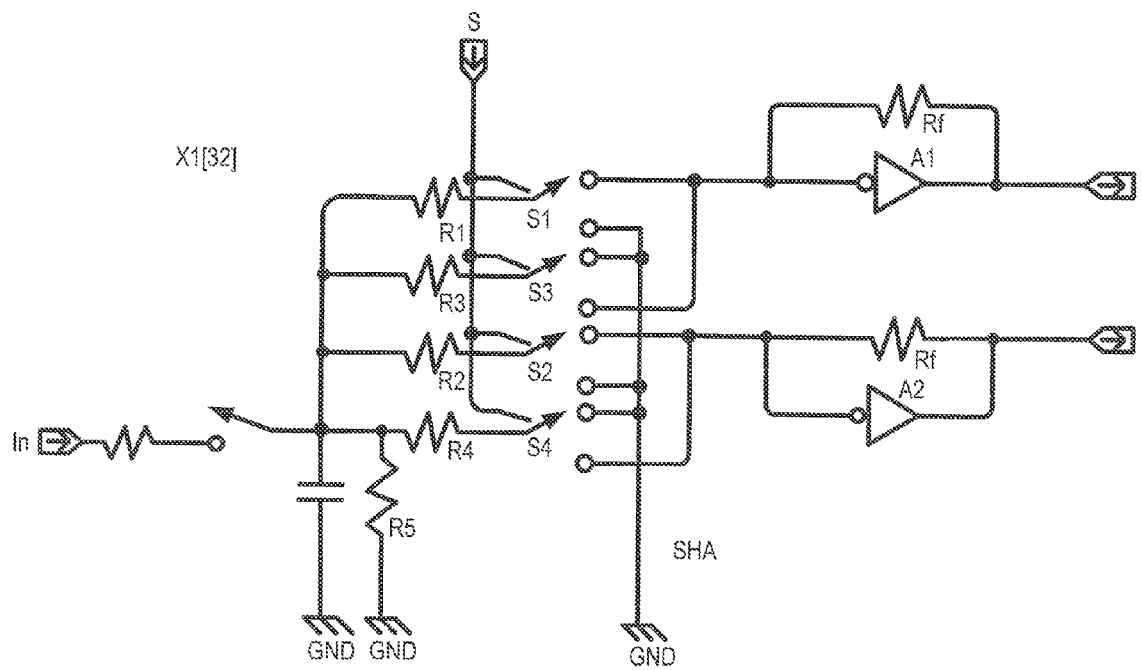
FIG. 20 is a circuit diagram showing a prototype design showing switches for selecting resistor values in repeated cells of the circuit of FIG. 19.

The same circuit is now extended with addition switches in the repeated cell that select between one of two sets of values. The prototype of this circuit is shown in FIG. 20.

With the S1/S2/S3/S4 switches as shown R1 and R2 connect as before, the new resistors R3 and R4 connect to ground. R5 is a compensating resistance to ground (where R3 was used in the prior drawings). If the sense of the switches is changed (by the 'S" input), then the roles of R1/R3 and R2/R4 are reversed, creating a different set of weighting coefficients. Assuming Xi and Yi represent the now two distinct sets of coefficients, the equations for the resistors are:

$$R1_i = \begin{cases} X_i \geq 0 \rightarrow \infty \\ X_i < 0 \rightarrow 1/X_i \end{cases} \quad R2_i = \begin{cases} X_i > 0 \rightarrow 1/X_i \\ X_i \leq 0 \rightarrow \infty \end{cases}$$

$$R3_i = \begin{cases} Y_i > 0 \rightarrow 1/Y_i \\ Y_i \leq 0 \rightarrow \infty \end{cases} \quad R4_i = \begin{cases} Y_i > 0 \rightarrow 1/Y_i \\ Y_i \leq 0 \rightarrow \infty \end{cases}$$

$$R5 = \frac{1}{\frac{1}{RT} - \frac{1}{R1} - \frac{1}{R2} - \frac{1}{R3} - \frac{1}{R4}}$$

Once again it should be clear that any given instance has three resistors and two SPDT (Single Pole Double Throw) switches since one of R1/R2 and one of R3/R4 is always infinite. And once again note that R5 is constructed to keep a constant load of RT on the capacitor.

Figure 21:
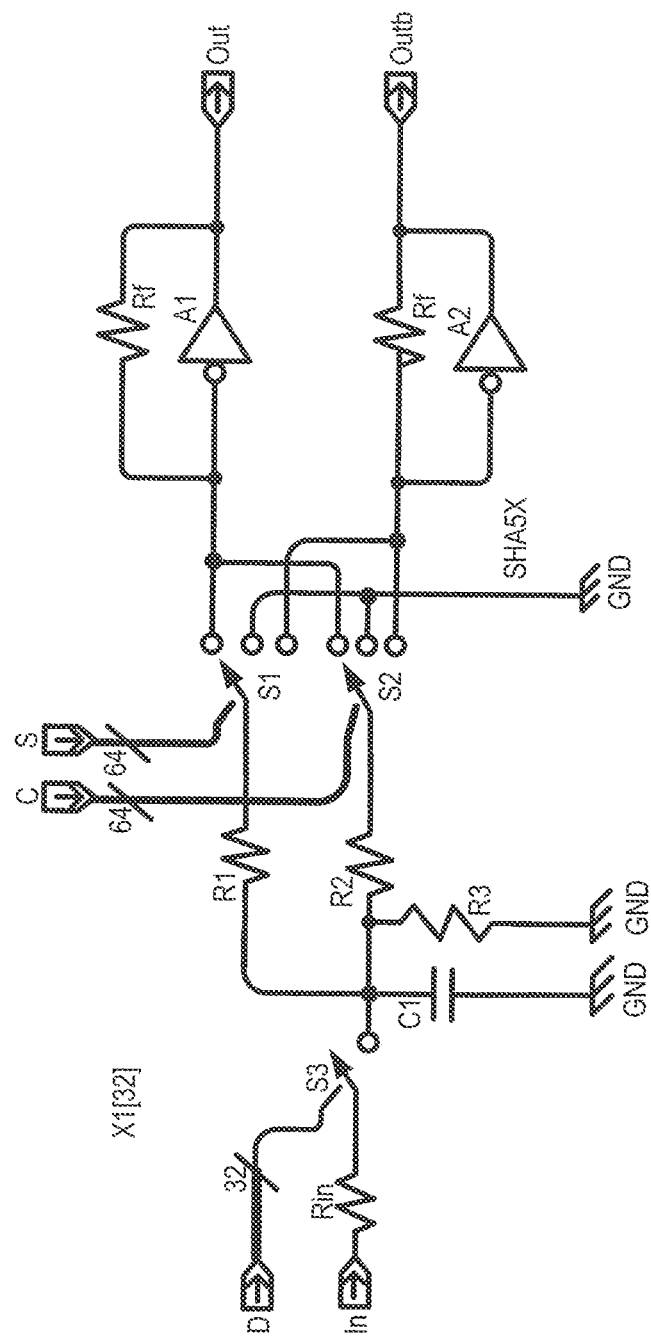
FIG. 21 is a circuit diagram showing a modification of the circuit of FIG. 20 according to the preferred embodiment to enable the reversal of coefficient values; and, FIG. 22 is a table of values of coefficients and states of switches at the 4 quantized sample values of the preferred embodiment.

The idea, of course, is to develop this simple DSM to the point where it is capable of virtually implementing the Weaver architecture filter. We are almost there at this point, having shown how the filter may consist of one single resistor in the entire circuit and how two coefficients may be selected with simple resistor networks to an output circuit. Surprisingly then, the circuit of FIG. 21, which appears somewhat simpler than the last one, adds the ability to reverse the coefficient value.

This circuit now need show only three resistors, and the values of the resistors are now determined by these expressions:

$$R1_i = \frac{1}{|X_i|} \quad R2_i = \frac{1}{|Y_i|} \quad R3_i = \frac{1}{\frac{1}{RT_i} - \frac{1}{R1_i} - \frac{1}{R2_i}}$$

We may now incorporate a practical maximum for the value of R1 and R2. Assuming that Rmax is the desired maximum resistor to use, we have:

$$R1_i = \min\left(\frac{1}{|X_i|}, R_{max}\right) \quad R2_i = \min\left(\frac{1}{|Y_i|}, R_{max}\right) \quad R3_i = \frac{1}{\frac{1}{RT_i} - \frac{1}{R1_i} - \frac{1}{R2_i}}$$

Note that the sign has been removed from the choice of resistors and is instead programmed into the switches. Specifically, suppose R1 in any given instance is derived from a positive value of X, then the switch S1 is connected in the lower position to drive A2 and 'Outb'. Conversely, if R1 is derived from a negative value S1 connects to the upper position and drives A1 and 'Out'.

This last design now has sufficient flexibility to implement the Weaver architecture approach. Recall that four phases of output are needed, corresponding to multiplication by a sine wave form in the coefficients, followed by a cosine form, followed by a negative sine form and finally a negative cosine form. Actually, it is not essential that the coefficients are sine and cosine, only that they are sinusoidal and shifted in phase by 90°. The circuit therefore works in four phases and FIG. 22 is a complete table or resistor values and states of the switches at times P0, P1, P2 and P3.

Note that the DSM is programmed for five cycles over the 32 elements, and that the initial phase has been set to a non-zero value to avoid the appearance of zeros in the coefficient values. The table is interpreted as follows: for example, in instance 9 the value of R1 is 30.1 k, the value of R2 is 16.02 k and the value of R3 is 229.405 k. There are four phases of the Weaver clock—for example, if the output intermediate frequency is desired to be 44 Mhz, the phases P0-P3 advance in equal steps at 176 Mhz. During P0 the switch S1 in element 9 is connected to ground. During P1 it is connected to the lower position (to A2) to make a positive output. During P2 it is again connected to ground. And finally during P3 it is connected to the upper position (to A1) to make a negative output. Similarly in instance 9 the switch S2 is connected to the upper position in P0, to ground during P1 and P3, and to the lower position during P2.

By use of the filter and virtual Weaver we have achieved, in a very simple circuit, an image-free down conversion. Note also that there are no active devices in the signal path, only FET devices operating as switches. Consequently there is no 1/F noise in the signal path and the circuit as shown can operate at zero IF. That is to say, using the example in the table, that if the DSM sample were to advance at 1 Ghz, it would complete one cycle in 1/32=31.25 Mhz and since five cycles are programmed into the coefficients the apparent local oscillator of the DSM is 156.25 Mhz. This means that a DC signal would emerge from the DSM if the input were at 156.25 Mhz. This DC signal, in the conventional implementation, would, due to the presence of active devices in the signal path, contain significant 1/F noise. It does not contain noise in this example. If, again as in the example, the virtual Weaver is clocked at 176 Mhz, then the output of 44 Mhz emerges for an input of 156.25 Mhz. The equivalent intermediate signal between the first and second quadrature multipliers of the Weaver—which is avoided by this invention—is at zero frequency. This has significant advantage: firstly the inherent sin(x)/x filtering of the DSM is centered on the signal, second the image rejection of the Weaver is only ever used to separate the positive and negative is frequencies of the presumed single sideband nature of the signal[1], and thirdly, the "image" being the other half of the desired signal, is only ever at the same amplitude: no loss of image rejection due to vastly different wanted and unwanted signal amplitudes is incurred.

[1] SSB Single Sideband is commonly used in modern radio systems and so centering the received signal on the equivalent local oscillator—making zero IF—still requires the positive and negative signal separation that the virtual Weaver provides.

The use of filtering within each sample and hold of a digital sampling mixer (DSM) of the general type disclosed in U.S. Pat. No. 7,028,070 removes the need for filters in the conventional and known-art Weaver image rejection circuit. Once the need for filters is removed, and provided that the DSM is capable of operating with at least two sets of selectable coefficients, then a time multiplexed virtual Weaver architecture is possible where the two arms of the Weaver are implemented one after the other at a rate at 4× the corresponding Weaver second intermediate frequency. The preferred implementation shows the two concepts operating together as simple resistor and switch networks and so suitable for an equivalent zero-IF virtual Weaver configuration.

It will be appreciated that the analog implementation of a quadrature-matched pair of mixers disclosed herein may be useful in other applications.

It will further be appreciated by those skilled in the art that the various embodiments have been represented and described in some detail but that modifications, particularly using equivalent circuit elements or devices embodying to equivalent circuit characteristics, may be practiced without departing from the principles of the invention.

It is claimed:

1. A circuit for processing a radio frequency input signal to achieve image rejection, comprising:
    switching means for selecting between four sets of multiplier scaling factors,
    said sets corresponding to the coefficients of a Fourier series approximation of a sinusoidal signal, the inverse of said sinusoidal signal, a cosine of said sinusoidal signal and the inverse of said cosine respectively, each of said sets of scaling factors being applied to samples of said input signal to produce multiplied outputs; and
    a summing circuit for sequentially summing said outputs of each of said sets.

* * * * *

UNITED STATES PATENT AND TRADEMARK OFFICE
CERTIFICATE OF CORRECTION

Page 1 of 1

PATENT NO. : 8,774,749 B2
APPLICATION NO. : 13/515259
DATED : July 8, 2014
INVENTOR(S) : Mallinson et al.

It is certified that error appears in the above-identified patent and that said Letters Patent is hereby corrected as shown below:

In the Drawings:
Fig. 8, insert reference number -- 13 --;
In the Specification:
Column 1, line 22, delete "is";
Column 2, line 36, delete "free" and insert -- 'frec' --;
Column 2, line 37, delete "to" and insert -- 'flo' --;
Column 2, line 66, delete "is";
Column 3, line 38, delete "is" at the end of the line;
Column 5, line 10, delete "is";
Column 8, line 43, delete "is";
Column 10, line 61, delete "T" and insert -- 'i' --;
Column 10, line 67, delete "1 k" and insert -- 1k --;
Column 11, line 1, delete "10 k" and insert -- 10k --;
Column 12, line 37, delete "30.1 k" and insert -- 30.1k --;
Column 12, line 37, delete "16.02" and insert -- 16.02k --;
Column 12, line 38, delete "k" in the beginning of the line;
Column 12, line 38, delete "229.405 k" and insert -- 229.405k --;
Column 12, line 41, delete "176 Mhz" and Insert -- 176Mhz --; and
Column 13, line 4, delete "is".

Signed and Sealed this
Fourteenth Day of October, 2014

Michelle K. Lee
*Deputy Director of the United States Patent and Trademark Office*

UNITED STATES PATENT AND TRADEMARK OFFICE
CERTIFICATE OF CORRECTION

| | | |
|---|---|---|
| PATENT NO. | : 8,774,749 B2 | Page 1 of 1 |
| APPLICATION NO. | : 13/515259 | |
| DATED | : July 8, 2014 | |
| INVENTOR(S) | : Mallinson et al. | |

It is certified that error appears in the above-identified patent and that said Letters Patent is hereby corrected as shown below:

On the title page, in the illustrative figure, insert reference number -- 13 -- at the CoSine block, at the far right of the figure;
In the Drawings:
Fig. 8, insert reference number -- 13 -- at the CoSine block, at the far right of the figure;
In the Specification:
Column 1, line 22, delete "is";
Column 2, line 36, delete "free" and insert -- 'frec' --;
Column 2, line 37, delete "to" and insert -- 'flo' --;
Column 2, line 66, delete "is";
Column 3, line 38, delete "is" at the end of the line;
Column 5, line 10, delete "is";
Column 8, line 43, delete "is";
Column 10, line 61, delete "T" and insert -- 'i' --;
Column 10, line 67, delete "1 k" and insert -- 1k --;
Column 11, line 1, delete "10 k" and insert -- 10k --;
Column 12, line 37, delete "30.1 k" and insert -- 30.1k --;
Column 12, line 37, delete "16.02" and insert -- 16.02k --;
Column 12, line 38, delete "k" in the beginning of the line;
Column 12, line 38, delete "229.405 k" and insert -- 229.405k --;
Column 12, line 41, delete "176 Mhz" and insert -- 176Mhz --; and
Column 13, line 4, delete "is".

This certificate supersedes the Certificate of Correction issued October 14, 2014.

Signed and Sealed this
Eleventh Day of November, 2014

Michelle K. Lee
*Deputy Director of the United States Patent and Trademark Office*